United States Patent

Jonas et al.

Patent Number: 5,300,575
Date of Patent: Apr. 5, 1994

[54] POLYTHIOPHENE DISPERSIONS, THEIR PRODUCTION AND THEIR USE

[75] Inventors: Friedrich Jonas, Aachen; Werner Krafft, Leverkusen, both of Fed. Rep. of Germany

[73] Assignee: Bayer Aktiengesellschaft, Leverkusen, Fed. Rep. of Germany

[21] Appl. No.: 989,731

[22] Filed: Dec. 10, 1992

Related U.S. Application Data

[63] Continuation of Ser. No. 647,093, Jan. 29, 1991, abandoned.

[30] Foreign Application Priority Data

Feb. 8, 1990 [DE] Fed. Rep. of Germany ....... 4003720

[51] Int. Cl.$^5$ .............................................. C08L 37/00
[52] U.S. Cl. ..................................... 525/186; 525/206
[58] Field of Search ................................. 525/186, 206

[56] References Cited

U.S. PATENT DOCUMENTS

| | | | |
|---|---|---|---|
| 4,147,550 | 4/1979 | Campbell et al. | 430/529 |
| 4,731,408 | 3/1988 | Jasne | 524/516 |
| 4,910,645 | 3/1990 | Jonas et al. | 361/525 |
| 4,959,430 | 9/1990 | Jonas et al. | 526/257 |
| 4,987,042 | 1/1991 | Jonas et al. | 526/257 |
| 5,035,926 | 7/1991 | Jonas et al. | 526/257 |

FOREIGN PATENT DOCUMENTS 0104726 4/1984 European Pat. Off. .
0253594 1/1988 European Pat. Off. .

OTHER PUBLICATIONS

J. Polym. Sci. Part A Polymer Chemistry, vol. 26, No. 5, 1287 (1988).

Primary Examiner—John C. Bleutge
Assistant Examiner—Helen F. Lee
Attorney, Agent, or Firm—Sprung, Horn, Kramer & Woods

[57] ABSTRACT

The invention relates to dispersions of polythiophenes made up of structural units corresponding to the following formula

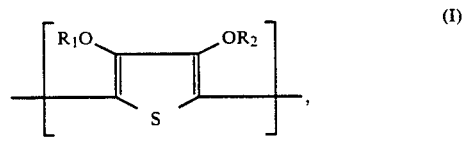

(I)

in which
R$_1$ and R$_2$ independently of one another represent hydrogen or a C$_{1-4}$ alkyl group or, together, form an optionally substituted C$_{1-4}$ alkylene group,
in the presence of polyanions, to the production of these dispersions and to their use for the antistatic treatment of plastic mouldings.

3 Claims, No Drawings

POLYTHIOPHENE DISPERSIONS, THEIR PRODUCTION AND THEIR USE

This application is a continuation of application Ser. No. 647,093, filed Jan. 29, 1991, now abandoned.

This invention relates to new polythiophene dispersions, to their production and to the use of the salts for the antistatic treatment of plastic moldings.

Polythiophene and their use for the antistatic treatment of plastic moldings and as organic conductors in electronic equipment and capacitors are known (see, for example, EP-A-253 594, 328 983, 328 981, 339 340 and 340 512).

EP-A-253 594 describes compositions of polythiophenes substituted in the 3,4-position by certain groups with monomolecular acids (hereinafter referred to as monoacids) and high molecular weight acids (hereinafter referred to as polyacids). Irrespective of whether they are derived from monoacids or polyacids, the compositions form powders or films which are insoluble in water and, in some cases, even in aprotic organic solvents. These insoluble powders and films cannot be used for the antistatic treatment of plastic moldings.

EP-A-328 983 describes polythiophene compounds which are substituted in 3,4-position by certain groups and which are soluble in aprotic organic solvents with monoacids while DP-A-328 981 describes the use of these compositions in electrically conductive coating compounds. The compositions are obtained by a complicated process, namely by electrochemical oxidation of the corresponding monomeric thiophenes in the presence of conductive salts. For the antistatic treatment of plastic moldings, these polythiophene compositions are applied to the moldings in the form of solutions in organic aprotic solvents.

EP-A-339 340 described compositions of polythiophenes substituted in the 3,4-position by certain groups with monoacids while EP-A-340 512 describes their use as solid electrolytes in capacitors. For the antistatic treatment of plastic moldings, the polythiophene compositions described in EP-A-339 340 are directly produced in situ on the moldings by chemical oxidation of the corresponding thiophene derivatives. Depending on the oxidizing agent used, oxidizing agent and monomeric thiophene may be applied to the moldings either successively from separate solutions or together from a single solution.

Although the known polythiophene compounds show good electrical properties and and, providing they can be applied to plastic moldings, provide the plastic moldings with good antistatic properties, they still do not meet technical requirements because it is desirable in practice to apply antistatic treatments from an aqueous medium which, in addition, are expected to have long shelf lives and good processing properties, i.e. should be able to be applied at high working speeds and should form the desired antistatic coating as soon as possible after application.

It has surprisingly been found that the thiophenes on which the polythiophenes described in EP-A-340 512 are based not only polymerize at high polymerization rates in the presence of polyacids, but also form in water stable compositions having the desired, favorable processing properties and that transparent, antistatic coatings can be produced from these compositions on plastic moldings, remaining antistatic even in the presence of atmospheric moisture.

As solvents for the compositions lower alcohols like methanol, ethanol or isopropanol as well as mixtures of water with said lower alcohols or with other water-miscible organic solvents like acetone are also suitable.

The average particle diameter of the particles of the dispersions can be up to 10 $\mu$m, preferably up to 3 $\mu$m and more preferably up to 1 $\mu$m.

In the case the particles have a greater diameter, they in addition to the antistatic effect by the charges provide an effect as matting agents, especially with photographic materials.

Accordingly, the present invention relates to dispersions of polythiophenes made up of structural units corresponding to the following formula

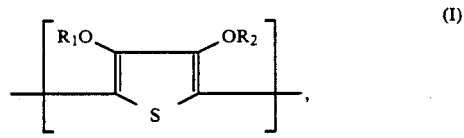

in which
$R_1$ and $R_2$ independently represent hydrogen or a $C_{1-4}$ alkyl group or, together, represent an optionally substituted $C_{1-4}$ alkylene group, preferably an optionally alkyl-substituted methylene group, an optionally $C_{1-2}$-alkyl- or phenyl-substituted 1,2-ethylene gourp, a 1,3-propylene group or a 1,2-cyclohexylene group, in the presence of polyanions.

The methyl and ethyl groups are mentioned above all as $C_{1-4}$ alkyl groups for $R_1$ and $R_2$.

Preferred representatives of the optionally substituted $C_{1-4}$ alkylene groups, which $R_1$ and $R_2$ may form together, are the 1,2-alkylene groups which are derived from the 1,2-dibromoalkanes obtainable by bromination of a-olefins, such as ethane, prop-1-ene, hex-1-ene, oct-1-ene, dec-1-ene, dodec-1-ene and styrene. Other representatives are the 1,2-cyclohexylene, 2,3-butylene, 2,3-dimethyl-2,3-butylene and 2,3-pentylene groups.

Preferred groups $R_1$ and $R_2$ are the methylene, 1,2-ethylene and 1,3-propylene groups, the 1,2-ethylene group being particularly preferred.

The polyanions are anions of polymeric carboxylic acids, such as polyacrylic acids, polymethacrylic acids or polymaleic acids, and polymeric sulfonic acids, such as polystyrene sulfonic acids and polyvinyl sulfonic acids. These polycarboxylic and polysulfonic acids may also be copolymers of vinyl carboxylic and vinyl sulfonic acids with other polymerizable monomers, such as acrylates and styrene.

The molecular weight of the polyacids supplying the polyanions is preferably in the range form 1,000 to 2,000,000 and more preferably in the range from 2,000 to 500,000. The polyacids or their alkali salts are commercially available, for example polystyrene sulfonic acids and polyacrylic acids, or may be produced by known methods (cf. for example Houben-Weyl, Methoden der organischen Chemie, Vol. E 20, Makromolekulare Stoffe, Teil 2, (1987), pp. 1141 et seq.).

Instead of the free polyacids required for the formation of the dispersions of polythiophenes and polyanions according to the invention, it is also possible to use mixtures of alkali salts of the polyacids and corresponding quantities of monoacids.

The polythiophene dispersions in the presence of polyanions according to the invention are obtained by oxidative polymerization of 3,4-dialkoxythiophenes corresponding to the following formula

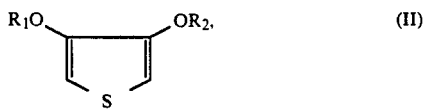 (II)

in which $R_1$ and $R_2$ are defined for formula (I), with oxidizing agents typically used for the oxidative polymerization of pyrrole and/or with the oxygen or air in the presence of the polyacids, preferably in aqueous medium, at temperatures of 0° to 100° C.

The polythiophenes get positive charges by the oxidative polymerization, which are not shown in the formula, because their number and position cannot be determined without doubt.

For polymerization, the thiophenes corresponding to formula (II), polyacid and oxidizing agent are dissolve in an organic solvent or—preferably—in water and the resulting solution is stirred at the polymerization temperature envisaged until the polymerization reaction is complete.

Where air or oxygen is used as the oxidizing agent, air or oxygen is introduced into the solution containing thiophene, polyacid and, optionally, catalytic quantities of metal salts until the polymerization reaction is complete.

The polymerization time may be between a few minutes and 30 hours, depending on the size of the bath, the polymerization temperature and the oxidizing agent. The polymerization time is generally between 30 minutes and 10 hours. The stability of the obtained dispersions may be improved by the addition of dispersing agents like sodium dodecyl sulphonate during or after polymerization.

The compositions obtained after polymerization may be directly used for the antistatic treatment of plastic moldings, i.e. may be directly applied to the moldings by known methods, for example by impregnation, spraying, low pressure coating, knife coating, spread coating, etc. After removal of the solvent, for example water, the antistatic layer form the polythiophene is directly obtained, remaining antistatic in the presence of atmospheric moisture.

Suitable oxidizing agents are any of the oxidizing agents suitable for the oxidative polymerization of pyrrole which are described, for example, in J. Am. Soc. 85, 454 (1963). For practical reasons, it is preferred to use inexpensive and easy-to-handle oxidizing agents, for example iron(III) salts, such as $FeCl_3$, $Fe(ClO_4)_3$ and the iron(III) salts of organic acids and inorganic acids containing organic residues, also $H_2O_2$, $K_2CR_2O_7$, alkali or ammonium persulfates, alkali perborates, potassium permanganate and copper salts, such as copper tetrafluoroborate. In addition, it has been found that air and oxygen, optionally in the presence of catalytic quantities of metal ions, such as iron, cobalt, nickel, molybdenum and vanadium ions, may advantageously be used as oxidizing agents.

The use of the persulfates and the iron(III) salts of organic acids and inorganic acids containing organic residues has the major applicational advantage that they are not corrosive.

Examples of iron(III) salts of inorganic acids containing organic residues are the iron(III) salts of sulfuric acid semiesters of $C_{1-20}$ alkanols, for example, the Fe(III) salt of lauryl sulfate.

The following are mentioned as examples of iron(III) salts of organic acids: the Fe(III) salts of $C_{1-30}$ alyl sulfonic acids, such as methane or dodecane sulfonic acid; aliphatic $C_{1-20}$ carboxylic acids, such as 2-ethylhexyl carboxylic acid; aliphatic perfluorocarboxylic acids, such as trifluoroacetic acid and perfluorooctanoic acid; aliphatic dicarboxylic acids, such as oxalic acid and, above all, aromatic, optionally $C_{1-20}$-alkyl-substituted sulfonic acids, such as benzenesulfonic acid, p-toluenesulfonic acid and dodecyl benzenesulfonic acid.

Mixtures of the above-mentioned Fe(III) salts of organic acids may also be used.

Theoretically, 2.25 equivalents of oxidizing agent per mol thiophene are required for the oxidative polymerization of the thiophenes corresponding to formula II (cf. for example J. Polym. Sci. Part A, Polymer Chemistry, Vol. 26, page 1287 (1988)). In practice, however, the oxidizing agent is used in certain excess, for example in an excess of 0.1 to 2 equivalents per mol thiophene.

Where weakly acidic polyacids, such as the polyacrylic acids, are used, it can be of advantage to add strong monoacids, such as hydrochloric acid, sulfuric acid or aromatic sulfonic acids, to the polyacids to increase the polymerization rate.

In the oxidative polymerization reaction, the polyacids to be used in accordance with the invention are added in such a quantity that, for every mol thiophene corresponding to formula (II), there are 0.25 to 10 and preferably 0.8 to 8 acids groups of the polyacid.

For the oxidative polymerization, the thiophenes corresponding to formula (II) and the polyacids are dissolved in such a quantity of solvent that stable polythiophene dispersions are obtained having solids contents of 0.5 to 55% by weight and preferably 5 to 30% by weight.

To obtain coatings having better adhesion and scratch resistance, polymeric binder soluble or suspendable in water, for example polyvinyl alcohol or polyvinyl acetate dispersions, may also be added to the polythiophene salt compositions.

In the case of acid-sensitive plastic moldings and in order to protect the apparatus used for application, if can be of advantage to neutralize excess free acid groups in the polythiophene salt compositions according to the invention before they are applied to the plastic moldings by addition of alkali or alkaline earth hydroxides, ammonia or amines.

After drying, the thickness of the layers in which the polythiophene dispersions according to the invention are applied to the plastic moldings to be antistatically treated is between 0.001 and 100 μm, depending on the desired conductivity of the molding and the desired transparency of the coating.

After application of the solutions, the solvent may e removed simply by evaporation at room temperature. However, to obtain higher processing speeds, it is of greater advantage to remove the solvent at elevated temperatures, for example at temperatures in the range from 20° to 150° C. and preferably at temperatures in the range from 40° to 100°· C.

The preparation of the polythiophene dispersion can be performed in the presence of polymer latices or polymer dispersions respectively which contain acidic groups as $-SO_3^\ominus$, $-COO^\ominus$ and $-PO_3^{2\ominus}$. Preferably the content of acidic groups is more than 2% by weight, to ensure a sufficient stability of the dispersion.

The particle size of the dispersion is in the range from 10 nm to 1 μm, preferably 40 to 400 nm.

Polymers suitable for this purpose are described in DE-A-25 41 230, DE-A-25 41 274, DE-A-28 35 856, EP-A-14 921, EP-A-69 671, EP-A-130 115 and U.S. Pat. N. 4,291,113.

The polymer dispersions or latices respectively may consist of straight-chain, branched or cross-linked polymers. Latices of cross-linked polymers with a high amount of acidic groups are swellable in water and are named micro gel.

Such amino gels are disclosed e.g. in U.S. Pat. Nos. 4,301,240, 4,677,050 and U.S. Pat. No. 4,147,550.

Substrates which may be antistatically or electrically conductively treated by the process according to the invention are, above all, moldings of organic plastics, particularly films of polycarbonates, polyamides, polyethylene, polypropylenes, polyvinyl chloride, polyesters, cellulose acetate and cellulose. However, inorganic materials, for example glass, or ceramic materials of aluminum oxide and/or silicon dioxide may also be antistatically treated by the process according to the invention.

The polythiophene dispersions according to the invention may also be used as antistatics of heat-sealable sheets as described in DE-A-38 38 652.

By virtue of their transparency, the coatings obtainable in accordance with the invention are particularly suitable for the antistatic treatment of photographic materials, particularly films, e.g. black-and-white films, colour negative films, colour reversal films preferably as a backside layer, with other words as a layer which is provided on the side of the support opposite to the silver halide emulsion layers.

The polythiophene dispersion is preferably coated in an amount of from 0.001 to 0.3 g/m² and more preferably in an amount of from 0.02 to 0.2 g/m².

A further object of the invention is a photographic material, which contains an anti-static layer with a polythiophene dispersion according to the invention.

EXAMPLE 1

Air is introduced into a solution of 2.0 g (11 mmol SO₃H groups) polystyrene sulfonic acid ($\overline{Mw}$ 4,000), 0.5 g 3,4-ethylenedioxythiophene (3.5 mmol) and 0.05 g iron(III) sulfate (0.2 mmol) in 20 ml water over a period of 24 hours at room temperature. Over this period, the composition becomes light blue in color.

The solution si then knife-coated onto a polycarbonate film using a hand coater (wet film thickness 25 μm, corresponding to a dry film thickness of about 2.5 μm). The coated film is dried to constant weight and stored for 24 hours at 0% relative humidity.

A transparent, light blue film is obtained; surface resistance ($R_{OB}$) of the film: $10^7$ Ω (at 0% relative humidity).

A transparent, light blue film is obtained; surface resistance ($R_{OB}$) of the film: $10^7 \Omega$ (at 0% relative humidity).

If the film is similarly coated with a composition diluted to one third (dry film thickness of the coating: approx. 1 μm), a transparent, light blue film is obtained; surface resistance ($R_{OB}$) of the film: $10^8 \Omega$ (at 0% relative humidity).

If the polycarbonate film is coated with the polythiophene composition adjusted to pH 8 with 10% by weight sodium hydroxide (dry film thickness: approx. 1.5 μm), a transparent, light blue film is again obtained; surface resistance ($R_{OB}$) of the film: $3 \times 10^7 \Omega$ (at 0% relative humidity).

If the film is coated with a 10% by weight solution of polystyrene sulfonic acid sodium salt, a commercially available antistatic agent (dry film thickness: approx. 2.5 μm), the surface resistance ($R_{OB}$) of the film is $>10^9 \Omega$ (at 0% relative humidity).

EXAMPLE 2

1.8 g (0.01 mol SO₃H) polystyrene sulfonic acid ($\overline{Mw}$ 4,000) and 1.4 g (0.01 mol) 3,4-ethylenedioxythiophene are added with stirring to a solution of 2.7 g (0.01 mol) potassium peroxidisulfate in 50 ml water, followed by stirring for 24 hours at room temperature. The composition is then diluted with 300 ml water and knife coated onto a cellulose triacetate film. The coated film is dried to constant weight at room temperature and then stored for 24 hours at 0% relative humidity.

Dry film thickness of the coating: approx. 0.5 μm. A substantially colorless transparent film is obtained; surface resistance ($R_{OB}$) of the film: $2 \times 10^7 \Omega$.

EXAMPLE 3

Air is introduced over a period of 8 hours with stirring at 60° C. into a solution of 10 g (54 mmol SO₃H) polystyrene sulfonic acid ($\overline{Mw}$ 4,000), 0.25 g (1 mmol) Fe(III) sulfate and 2.5 g (0.18 mmol) 3,4-ethylenedioxythiophene in 100 ml water. A polycarbonate film is coated with the light blue composition thus obtained. The film is freed from the solvent at 70° C. (dry film thickness: approx. 2.5 μm). The film is stored for 24 hours at 0% relative humidity. A transparent light blue film is obtained: surface resistance ($R_{OB}$) of the film: $2 \times 10^6 \Omega$.

If the polycarbon film is coated with the light blue composition diluted with water to one third, the colorless transparent film obtained has a surface resistance ($R_{OB}$) of $8 \times 10^6 \Omega$.

EXAMPLE 4

A polythiophene composition prepared in accordance with Example 3 is diluted with a mixture of methanol and water (1:1) to a solids content of 0.8% by weight. Using a casting machine comprising a typical rinsing roller, the composition is then applied to a polyester film substrate provided with a commercially available adhesive layer. The coated film is dried at 70° C.; the solids coating on the film after drying comprises 150 mg/m.

The substantially colorless transparent antistatic layer has a surface resistance ($R_{OB}$) of $3 \times 10^6 \Omega$ at 0% relative humidity.

An equivalent antistatic coating is obtained in the same way on the triacetate film substrate provided with a commercially available adhesive layer.

EXAMPLE 5

Air is introduced for 6 hours at 80° C. into a solution of 6 g (30 mmol SO₃H) polystyrene sulfonic acid ($\overline{Mw}$ 4,000), 0.15 g (0.6 mmol) iron(III) sulfate and 1.0 g (7 mmol) 3,4-ethylenedioxythiophene in 100 ml water.

After cooling to room temperature, the polymerization mixture is diluted with a mixture of methanol and water(1:1) to a solids content of 4% by weight.

The composition is applied as described in Example 4 to a polyethylene terephthalate film provided with a commercially available adhesive layer. The solids coating after drying at 70° C. comprises approximately 60 mg/m². The substantially colorless, transparent antistatic coating has a surface resistance of $5 \times 10^8 \Omega$ at 0% relative humidity.

EXAMPLE 6

Air is introduced for 24 hours at 50° C. into a solution of 5 g (26 mmol SO₃H) polystyrene sulfonic acid ($\overline{M}w$ 4,000), and 0.6 g (4 mmol) 3,4-ethylenedioxythiophene in 50 ml water. The polymerization mixture obtained is knife-coated onto a polycarbonate film using a hand coater (wet film thickness: 25 μm, corresponding to a dry film thickness of approximately 2.5 μm). The coated film is dried to constant weight.

The surface resistance of the film measures $10^9 \Omega$ at 0% relative humidity.

EXAMPLE 7

Air is introduced over a period of 16 hours with stirring at 40° to 50° C. into a solution of 5.5 g (26 mmol SO₃Na) polystyrene sulfonic acid ($\overline{M}w$ 4,000) Na⁺ salt, 3.0 g (17 mmol) p-toluenesulfonic acid, 2.5 g (17 mmol) 3,4-ethylenedioxythiophene and 0.25 g (1 mmol) iron (III) sulfate in 100 ml water.

The polythiophene composition obtained is then diluted with 200 ml water and 100 ml methanol and knife-coated onto a polycarbonate film.

After drying (drying film thickness approximately 0.7 μm), the coating has a surface resistance ($R_{OB}$) of $7 \times 10^7 \Omega$.

EXAMPLE 8

The polythiophene composition prepared in accordance with Example 7 is diluted with 400 ml water and, after the addition of 5.0 g polyvinyl alcohol, is stirred until a homogeneous composition is obtained.

The composition is knife-coated onto a polycarbonate film. After drying (dry film thickness approximately 0.7 mm), the antistatic coating has a surface resistance ($R_{OB}$) of $1.5 \times 10^8 \Omega$ (at 0% relative humidity).

EXAMPLE 9

A photosensitive multilayer structure of the composition described below is cast onto the front side of a transparent triacetate substrate of a thickness of 125 μm which has an adhesive layer on its front side.

The quantitative data relate in each case of 1 m²; the quantity of silver halide applied corresponds to an equivalent quantity of AgNO₃; all of the silver halide emulsions are stabilised with 0.1 g of 4-hydroxy-6-methyl-1,3,3a,7-tetra-azaindene per 100 g of AgNO₃.

| Layer structure: (front side) |
| --- |
| Layer 1: (antihalo layer) |
|     0.2 g of black colloidal silver |
|     1.2 g of gelatin |
|     0.1 g of UV absorber UV 1 |
|     0.2 g of UV absorber UV 2 |
|     0.02 g of tricresyl phosphate |
|     0.03 g of dibutyl phthalate |
| Layer 2: (intermediate micrate layer) |
|     0.25 g of AgNO₃ of a micrate-Ag (Br,I) emulsion: average particle diameter =0.07 μm. |
|     0.5 mol % of iodide |
|     1.0 g of gelatin |
|     0.05 g of coloured coupler RM 1 |
|     0.10 g of tricresyl phosphate |
| Layer 3: (low-sensitivity red-sensitized layer) |
|     2.2 g of AgNO₃, 4 mol % of iodide, average particle diameter 0.45 μm, red-sensitised |
|     2.0 g of gelatin |
|     0.6 g of colourless cyan coupler C 1, emulsified in 0.5 g of tricresyl phosphate (TCP) |
|     50 mg of colourless cyan coupler RM 1 and |
|     30 mg of DIR coupler DIR 1, emulsified in 20 mg of TCP. |
| Layer 4: (high-sensitivity red-sensitized layer) |
|     2.8 g of AgNO₃, 8.5 mol % of iodide, average particle diameter 0.8 μm, red-sensitised |
|     1.8 g of gelatin |
|     0.15 g of colourless cyan coupler C 2, emulsified in 0.15 g of dibutyl phthalate (DBP), |
| Layer 5: (separation layer) |
|     0.7 g of gelatin |
|     0.2 g of 2,5-diisooctylhydroquinone, emulsified with 0.15 g of DBP |
| Layer 6: (low-sensitivity green-sensitized layer) |
|     1.8 g of AgNO₃ of a spectrally green-sensitized Ag(Br,I) emulsion |
|     containing 4.5 mol % of iodide and having an average particle diameter of 0.4 μm |
|     1.6 g of gelatin |
|     0.6 g of magenta coupler M 1 |
|     50 mg of mask coupler YM 1, emulsified with 50 mg of TCP, |
|     30 mg of DIR coupler DIR 2, emulsified in 20 mg of DBP |
|     30 mg of DIR coupler DIR 3, emulsified in 60 mg of TCP |
| Layer 7: (high-sensitivity green-sensitized layer) |
|     2.2 g of AgNO₃, with 7 mol % of iodide and an average particle diameter of 0.7 μm - green-sensitised, |
|     1.4 g of gelatin |
|     0.15 g of magenta coupler M2, emulsified with 0.45 g of TCP, |
|     30 mg of the same mask coupler as in the 6th layer, emulsified with 30 mg of TCP |
| Layer 8: (separation layer) |
|     0.5 g of gelatin |
|     0.1 g of 2,5-diisooctylhydroquinone, emulsified with 0.08 g of DBP |
| Layer 9: (yellow filter layer) |
|     0.2 g of Ag (yellow colloidal silver sol) |
|     0.9 g of gelatin |
|     0.2 g of 2,5-diisooctylhydroquinone, emulsified with 0.16 g of DBP |
| Layer 10: (low-sensitivity blue-sensitive layer) |
|     0.6 g of AgNO₃, 4.9 mol % of iodide, average particle diameter 0.45 μm - blue-sensitised. |

-continued

| Layer structure: (front side) |
|---|

0.85 g of gelatin
0.7 g of yellow coupler Y 1, emulsified with 0.7 g of TCP,
0.5 g of DIR coupler DIR 3, emulsified with 0.5 g of TCP Layer 11: (high-sensitivity blue-sensitive layer)
1.0 g AgNO₃, 9.0 mol % of iodide, average particle diameter 0.9 μm, blue-sensitised
0.85 g of gelatin
0.3 g of the same yellow coupler as in the 10th layer, emulsified with 0.3 g of TCP Layer 12: (protective and hardening layer)
0.5 g of AgNO₃ of a micrate Ag(Br,I) emulsion, average particle diameter 0.07 μm, 0.5 mol % of iodide,
1.2 g of gelatin
0.4 g of a hardening agent of the formula
(CH₂=CH—SO₂—CH₂—CONH—CH₂)₂
1.0 g of a formaldehyde scavenger of the formula

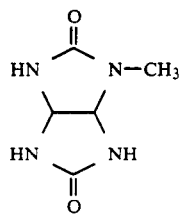

UV-1

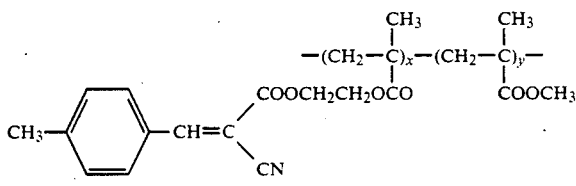

ratio by weight: x:y = 7:3

UV-2

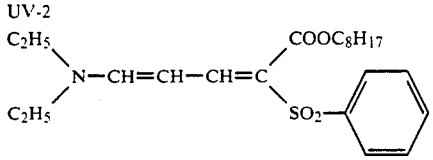

M 1

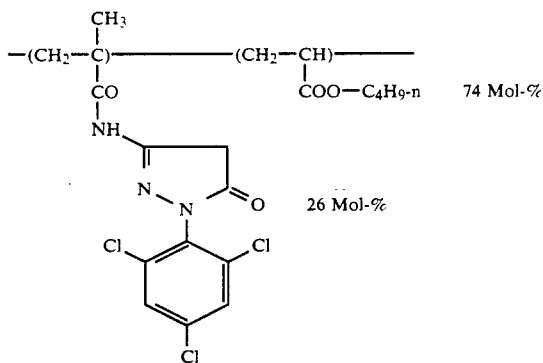

M 2

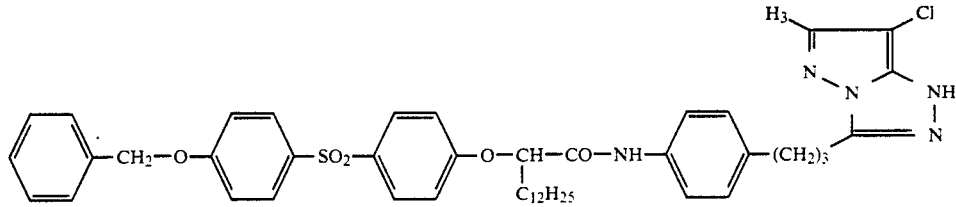

-continued
Layer structure: (front side)
Y1
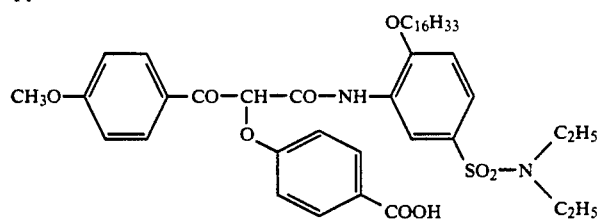
RM1
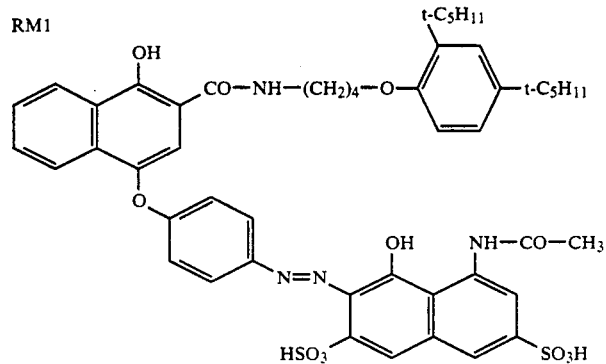
YM1
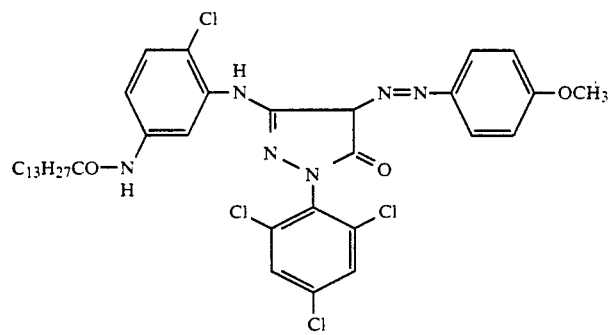
DIR 1
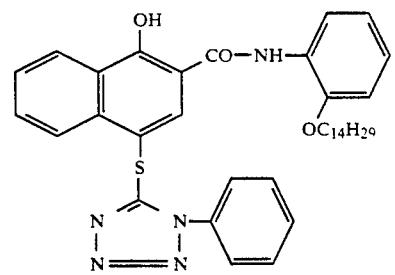
DIR 2
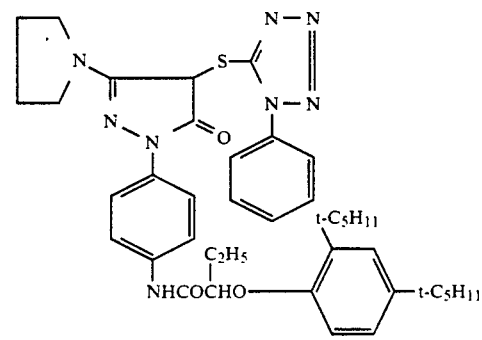

-continued
Layer structure: (front side)

DIR 3

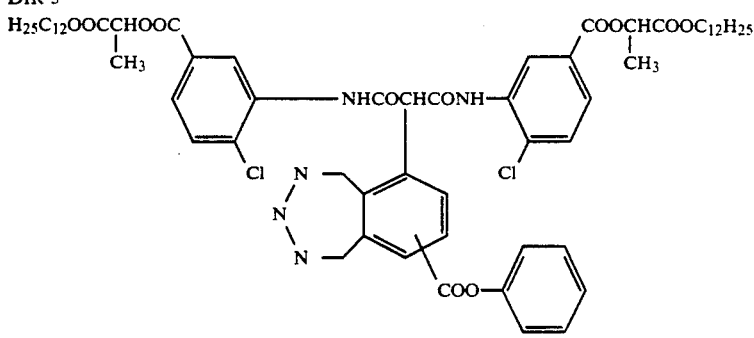

C 1

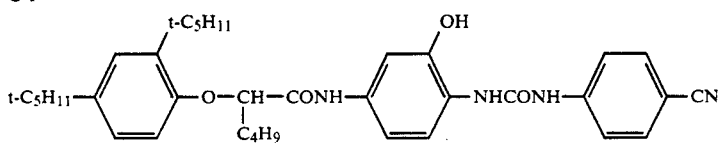

C 2

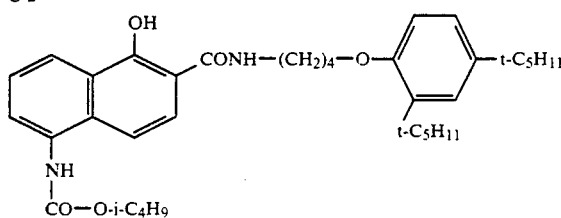

The total (dry) layer thickness of the colour laminate is 24 μm.

Antistatic layers (reverse sides)

The antistatic layers 1a+2a, together with cover layers 1b+2b, are applied to the substrate-free reverse side of the photosensitive colour material described above. The antistatic layer 3a (without any covering layer) is applied to a triacetate substrate additionally provided on its reverse side with an adhesive layer.

The antistatic polythiophene/PSS is prepared as follows:

10.0 g of polystyrenesulphonic acid (MG 4000) and 2.8 g of 3,4-ethyelenedioxy-thiophene are added with stirring to a solution of 1.2 g of potassium peroxydisulphate in 200 ml of water and the mixture is then stirred for a further 24 hours at room temperature. Then the dispersion is diluted with 300 ml of water (=stock dispersion; polythiophene/PSS content: 2.6% by weight).

The conductivity values (measured as the surface resistance (SR) in ohms per square, expressed as $\Omega/\square$, at various relative atmospheric humidities) indicated in the table under the antistatic layers demonstrate the advantage of the new antistatic layers based on polythiophene according to the invention:

1. The SR values of the polythiophene-containing layers are 2 powers of ten lower than in the case of the pure PSS layer (=comparative type 1);
2. even with very low atmospheric humidities (10%) the surface conductivity of the polythiophene layers does not change, in contrast to the comparative type, and
3. the conductivity of the polythiophene layers remains permanent, i.e. it remains after development.

EXAMPLE 10

64.6 g of a dispersion based on 47.5% by weight of methyl methacrylate, 47.5% by weight of butadiene and 5% by weight of the sodium slat of 2-acrylamido-2-methylpropanesulphonic acid having an average particle diameter of 171 nm, in water with a solids content of 31% by weight are diluted with 500 ml of water. After adding 5.4 g of potassium peroxydisulphate, 2.0 g of polystyrenesulphonic acid and 8.0 g of 3,4-ethylenedioxythiophene the dispersion is stirred for 24 hours at room temperature. During this period air is passed through the dispersion. The preparation is cast onto a polyester film in a quantity of 200 mg/m. (dry substance). After drying, a transparent coating is obtained with an optical density of 0.01 in the ortho range (white light) and a surface resistance of $6 \times 10^7 \Omega/\square$.

TABLE 1

| Antistatic layer | 1a | 2a | 3a |
|---|---|---|---|
| Sodium salt of polystyrene-sulphonic acid (13% strength by weight in H$_2$O) [ml] | 33 | — | — |
| polythiophene/PSS [g] | — | 3 | 3 |
| water [ml] | 2 | 247 | 484 |
| methanol [ml] | 365 | 100 | 500 |
| acetone [ml] | 600 | 650 | — |
| wetting agent (4% strength by weight in water) | | | 10 |
| polyethylene dispersion (5% strength by weight in H$_2$O) [ml] | — | — | 3 |
| Wet coating [ml] | 16 | 20 | 20 |

TABLE 1-continued

| Covering layer | 1b | 2b | — |
|---|---|---|---|
| Cellulose diacetate (10% strength by weight in acetone [ml] | 20 | 20 | |
| methanol [ml] | 530 | 330 | |
| acetone [ml] | 430 | 630 | |
| water [ml] | 19 | 17 | |
| polyethylene dispersion (5% strength by weight in H$_2$O [ml] | 1 | 3 | |
| Wet coating (ml) | 15 Comparative example | 15 | |
| SR [Ω/□] at 50% RH | $2 \cdot 10^9$ | $5 \cdot 10^7$ | $3 \cdot 10^7$ |
| at 10% RH | $5 \cdot 10^{10}$ | $6 \cdot 10^7$ | $3 \cdot 10^7$ |
| after development at 50% RH | $>10^{12}$ | $9 \cdot 10^7$ | $6 \cdot 10^7$ |
| opt. density (white) | 0.06 | 0.07 | 0.07 |

EXAMPLE 11 a) Preparation of the polythiophene:

Air is blow into a solution of 50 g of polystyrenesulphonic acid, 6.0 g of potassium peroxydisulphate and 14.0 g of 3,4-ethylenedioxythiophene in 1000 ml of water for 24 hours with stirring at room temperature. The composition has a solids content of 5.7% by weight (1h/100° C.) and is ready for use.

b) Preparation of the antistatic layer

A mixture of:
66 ml of the above polythiophene composition and
2 ml of a 5% strength by weight wetting agent solution in 932 ml of water is applied to a polyethylene terephthalate substrate (PET) provided with an adhesive layer of a terpolymer latex of vinylidene chloride/methacrylate/itaconic acid and colloidal silicic acid with a surface area of 100 m$^2$/g.

Wet coating: 50 m$^2$/; casting speed: 5 m/min; drying temperature: 120° C./2 min.

An almost colourless layer is obtained with the following surface conductivities:

SR [Ω/□] at 30% RH—prior to photographic processing: $0.7 \cdot 10^9$ —after photographic processing: $4 \cdot 10^9$ Thus the layer is permanently antistatic.

EXAMPLE 12

The antistatic layer produced according to Example 11 is additionally coated with a covering layer of 1 g/m$^2$ of polymethyl methacrylate (PMMA) from a solvent mixture of acetone/methoxypropanol 80/20. The transparent antistatic layer has the following surface resistance [Ω/□]:

| | 30% RH/21° C. | 60% RH/21° C. |
|---|---|---|
| prior to photographic development | $1.6 \cdot 10^{10}$ | $0.15 \cdot 10^{10}$ |
| after photographic development | $1 \cdot 10^{10}$ | $0.03 \cdot 10^{10}$ |

If a capacitive measurement is made of the decay time of the electric charge the following values are obtained:

| | 30% RH/21° C. |
|---|---|
| prior to photographic development | 0.53 |
| after photographic development | 1.1 |

As is clear from the above values the antistatic layers according to the invention display a very high permanence in addition to high conductivity and the surface conductivity increases even further after development.

EXAMPLE 13

Particularly good surface conductivities are obtained with an antistatic layer of the following composition:

| polythiophene composition acc. to Ex. 11 (57% strength by weight) | 66 ml |
|---|---|
| water | 820 ml |
| isopropanol | 100 ml |
| polyurethane dispersion, 40% strength by weight | 1.5 ml |
| polyethylene dispersion, 2.5% strength by weight | 15 ml |
| wetting agent, 10% strength by weight | 1.5 ml |
| | 1000 ml |

Applied quantity: b 30 m$^2$/l; casting speed: 8 m/min. Drying temperature: 130° C./1.25 min.

| | 30% RH/21° C. | 60% RH/21° C. |
|---|---|---|
| SR [Ω/□]: | | |
| prior to photographic development | $<0.1 \cdot 10^8$ | $<0.1 \cdot 10^8$ |
| after photographic development | $3 \cdot 10^8$ | |
| RC [msec]: | | |
| prior to photographic development | $<0.0064$ | |
| after photographic development | 0.05 | |

If this antistatic layer is coated with a covering layer of PMMA according to Example 12, slightly lower surface conductivities (=higher SR values) are measured, the short decay time for electrostatic charges, which is crucial from the point of view of static marks, remains unchanged, and in particular even following development.

| | 30% RH/21° C. | 60% RH/21° C. |
|---|---|---|
| SR [Ω/□] | | |
| prior to photographic development | $3 \cdot 10^9$ | $0.04 \cdot 10^9$ |
| after photographic development | $0.3 \cdot 10^9$ | |
| RC [msec.] | | |
| prior to photographic development | $<0.0064$ | |
| after photographic development | $<0.0064$ | |
| Optical density of the layers: | ortho: 0.01 (350–630 nm) UV 0.01 (370 nm) | |

We claim:

1. A solution of a polythiophene comprising water or a mixture of water with a water-miscible organic solvent as the dispersing medium, a polythiophene made up of structural units of the formula

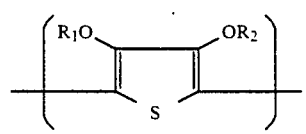

(I)

in which $R_1$ and $R_2$ each independently is hydrogen or a $C_{1-4}$ alkyl group or, together, form an optionally substituted $C_{1-4}$ alkylene group, and a polyanion derived from polystyrene sulfonic acid having a molecular weight in the range from 2,000 to 500,000, the polythiophene having been polymerized in the presence of a polyanion of polystyrene sulfonic acid having a molecular weight in the range from 2,000 to 500,000 by oxidative chemical polymerization.

2. A solution of a polythiophene according to claim 1, wherein the dispersing medium comprises water.

3. A solution of polythiophene according to claim 1, wherein
   $R_1$ and $R_2$ together form an optionally alkyl-substituted methylene group, an optionally $C_1$–$C_{12}$-alkyl or phenyl-substituted 1,2-ethylene group, a 1,3-propylene group or a 1,2-cyclohexylene group.

* * * * *